United States Patent [19]

Mundschenk

[11] 4,167,301
[45] Sep. 11, 1979

[54] POWER CORD STRAIN RELIEF

[75] Inventor: Glenn R. Mundschenk, Utica, N.Y.

[73] Assignee: General Electric Company, New York, N.Y.

[21] Appl. No.: 936,208

[22] Filed: Aug. 24, 1978

[51] Int. Cl.² ............................................. H01R 13/58
[52] U.S. Cl. ....................................................... 339/105
[58] Field of Search ............................. 339/105, 103 R

[56] References Cited

U.S. PATENT DOCUMENTS

| 3,545,432 | 12/1970 | Berman | 339/105 |
| 4,117,998 | 10/1978 | Notoya | 339/105 |

Primary Examiner—Roy Lake
Assistant Examiner—DeWalden W. Jones
Attorney, Agent, or Firm—Carlos Nieves; George R. Powers

[57] ABSTRACT

A strain relief arrangement associated with a removable wall of a housing includes an integral member which defines a cavity; a post within the cavity; and a slot communicating with the cavity and the inside of the housing. The wall and member provide a depressed region adjacent the cavity, the depressed region including a set for a removable cover, and a pair of holes through which fingers of the cover can engage the inside of the wall. When the fingers engage the wall, a screw can be put through a hole in the cover to engage the post and secure the cover. An abutment on the cover cooperates with the cavity to define a second slot, each of the slots being large enough to slidably but snuggly accommodate a power cord. A cord extending through the slots and around the post is anchored by the assembled arrangement. Removal of the cover allows removal of the cord from the post and relative motion between the cord and wall, such as may be required during coupling or decoupling of the wall with respect to the rest of the housing.

10 Claims, 4 Drawing Figures

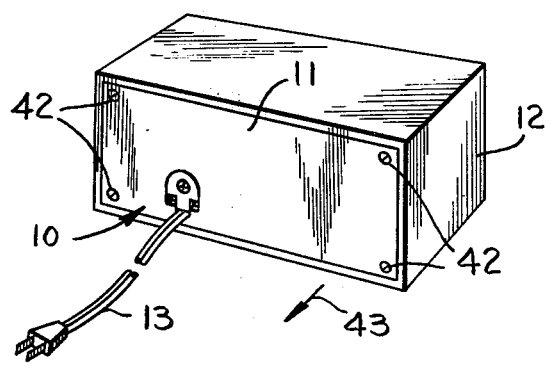
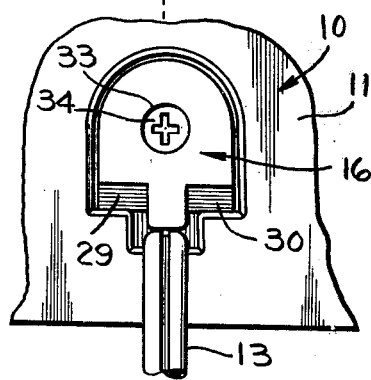
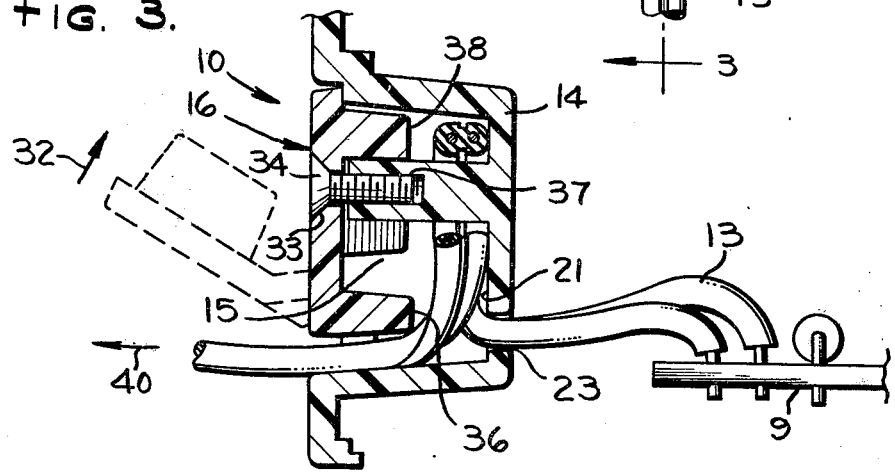
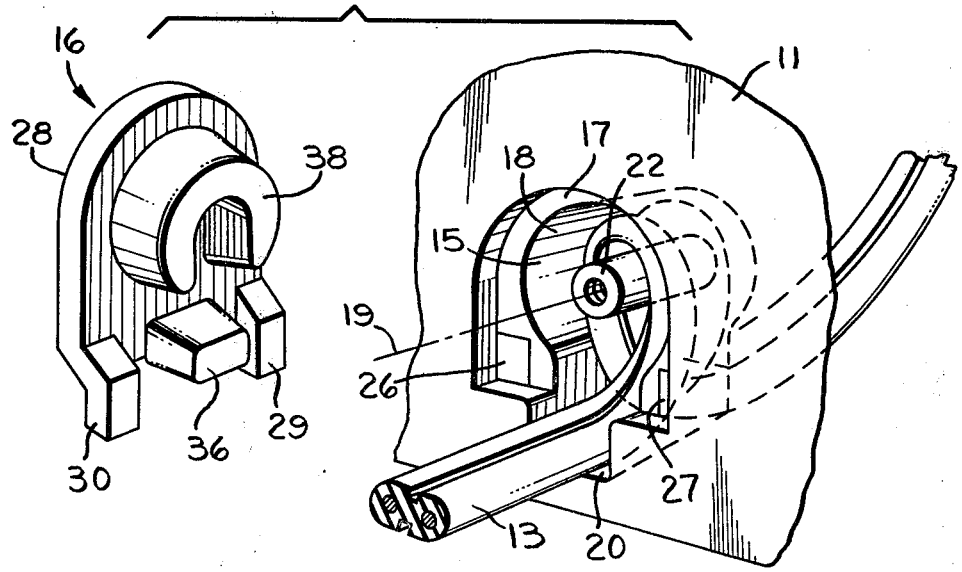

POWER CORD STRAIN RELIEF

BACKGROUND OF THE INVENTION

1. Field of the Invention

The subject invention relates to devices such as used to provide strain relief to housed connections between electrical power cords and circuitry.

2. Description of Prior Art

As is well-known, radio receivers generally include a housing having a removable back wall, a circuit in the housing, and an electrical power cord fastened to the back wall and electrically connected to the circuit. The back wall is generally connected to the rest of the housing by screws or the like and the cord is fastened to the back wall to prevent rupture of the electrical connection if a section of the cord outside the housing is inadvertently pulled. Generally, the length of the cord which is between the back wall and the circuit is sufficient to allow removal of the back wall to grant access to the circuitry or to internally disposed means used to fasten the cord. Externally disposed means are also available to fasten cords to the back of radio receivers. For example, strain relief bushings are known which can be engaged with a cord and pushed into engagement with a hole located in a back wall of a receiver. However, these devices inherently push a length of cord into the housing which otherwise is not required. It should be noted that a section of cord in a housing, which is free to allow the removal of an associated back wall, is also free to move against the contents of the housing and this can be dangerous if such contents are, for example, a resistor capable of getting hot enough to melt the cord. Moreover, it should be noted that any cord which is longer than is necessary to provide power places an unnecessary cost burden on the associated radio.

SUMMARY OF THE INVENTION

It is an object of the present invention to provide a strain relief apparatus which can secure an electrical cord extending into a housing and connected to circuitry therein after slack has been removed from the cord length in the housing.

Briefly, what is broadly considered to be inventive is strain relief apparatus, supported by a wall of a housing, for selectively permitting relative motion between a cord extending into the housing and the wall. Structurally, the apparatus comprises a member having a cavity extending towards the inside of the housing from the outside of the wall and a first slot in communication with the cavity and the inside of the housing; a post supported in the cavity; a movable cover for the cavity, and means for securing the cover to the member from the outside of the wall, the secured cover cooperating with the member to define a second slot. With the cover secured, if the cord extends through the first slot, around the post and through the second slot the cord will be anchored to the wall with the apparatus and with the cavity uncovered the cord can be moved with respect to the wall through the first slot.

BRIEF DESCRIPTION OF THE DRAWING

The above-mentioned and other objects and features of the invention will become apparent by reference to the following description in conjunction with the accompanying drawing, in which:

FIG. 1 is an environmental perspective view of strain relief apparatus, according to the invention;

FIG. 2 is a plan view of a back wall of a housing which supports the strain relief apparatus;

FIG. 3 is a cross-sectional view of the strain relief apparatus shown in FIG. 2, the view being taken along lines 3—3 in FIG. 2, and part of a circuit located within the housing; and FIG. 4 is a perspective view of disassembled parts of the strain relief apparatus.

DESCRIPTION OF A PREFERRED EMBODIMENT

Referring to FIG. 1, a strain relief apparatus 10, according to the invention, is located in the back wall 11 of a housing 12 and engages and electrical power cord 13 used to supply electrical power to a circuit in the housing. Housing 12 can be, as in this embodiment, a radio cabinet having a printed circuit board 9 (see FIG. 3) to which the ends of cord 13 can be attached with solder, or some other type of equipment having an internal cord connection requiring protection against strain caused by external forces applied to the cord.

As shown in FIGS. 3 and 4, apparatus 10 includes a member 14 whose surface defines a cavity 15 within which a curled section of cord 13 is placed, and a removable cover 16 which, when connected to the member, secures or anchors the cord. Structurally, in this embodiment, member 14 is integrally formed with wall 11 and defines a depressed region which provides a seat 17 for cover 16. Cavity 15 includes an annular section 18, having an axis 19 which is normal to wall 11, and a groove section 20 extending radially from the axis and in communication with the annular section along its full length. As may be seen, one longitudinal end of cavity 15 is disposed in communication with the depressed region and the other longitudinal end is contiguous with a wall 21, which is parallel to wall 11 and is part of member 14. Wall 21 integrally supports a post 22 co-axially disposed with respect to the annular section and includes a slot 23 which communicates with the groove section 20 and the inside of the housing. Slot 23 is adapted to snuggly but slidably accommodate cord 13. Member 14 also defines a pair of holes 26 and 27 in corners of seat 17, which communicate with the inside of the housing and, as will appear, are useful in providing a strong connection between the member and cover 16.

Cover 16 includes a flat base member 28 from which a pair of fingers 29 and 30, disposed in parallel, extend. Fingers 29 and 30 initially extend away from the base at an acute angle and then extend in a direction parallel with the base member. Fingers 29 and 30 are spaced so as to be movable through holes 26 and 27, respectively, and, when this is done, the cover appears as indicated by the dotted lines in FIG. 3. The edge of member 28 is contoured to provide a slidable but snug fit between the member and the depressed region when cover 16, located as indicated by the dotted lines, is rotated as indicated by the arrow 32 against seat 17. With the cover seated, a hole 33 in the base member 28 is aligned with axis 29 and a screw 34 extending through the hole engages a threaded hole 37 in the post, thereby securing the cover in place. Between fingers 29 and 30, there extends from the base member 28 an abutment 36 which, when the cover is in place, extends over a section of the groove section 20 and defines a second slot through which cord 13 extends into the cavity. Cover 16 also includes a plug 38 extending from the base member and partially surrounding hole 33. When cover 16 has been secured with screw 34, plug 38 extends into the annular section and a cord curled around the post 22 is urged towards wall 21.

Referring to FIG. 3, with the apparatus assembled and in engagement with cord 13, a pull on the cord in the direction indicated by arrow 40 moves the cord into engagement with the abutment and frictional forces are established which, at least partially, oppose the force associated with the pull. Cord 13 extends through a right angle twist and bend prior to passing around the post and movement of the cord by a pull as referred to causes a frictional engagement between the cord and post which also tends to overcome the force associated with the pull. Cord 13 also extends through a right angle twist and bend in passing from the cavity through slot 23 and a pull, such as disclosed, can bring the cord and slot into frictional engagement to provide another bucking force. In addition to the friction forces, the force associated with the pull is opposed by forces related to the stiffness of the cord. When the sum of the reaction forces caused to exist by the post and slots is equal to the force of the pull, the part of the cord which is located in the housing remains fixed.

When cord 13 is pulled in the direction of arrow 40, cord 13 exerts a force on abutment 36. This force is principally transmitted by the cover to the inside of wall 11 by parts of the fingers 29 and 30 which extend into the housing through holes 26 and 27 and move against the wall when the cover is moved as described above with reference to arrow 32. The force is also transmitted by the screw 34 to the post and by the base member 28 against the walls defining the depression. Thus, cover 16 distributes the forces exerted when the cord is pulled, thereby minimizing highly localized stresses.

Referring to FIGS. 1 and 3, wall 11 is connected, in this example, to other walls of the housing 12 by screws 42. To gain access to the inside of the housing, screw 34 is removed, cover 16 is rotated until fingers 29 and 30 can be withdrawn from holes 26 and 27, respectively, cord 13 is unwrapped from around post 22, screws 42 are removed, and wall 11 is moved away from the other walls in the direction indicated by arrow 43. Cord 13 is only slidably engaged within slot 23 and, therefore, only an insignificant amount of strain is placed on the connection between the circuit board 9 and the cord 13 as the wall 11 is moved relative to the cord. When access is no longer required, wall 11 is moved towards the other walls of the housing and secured with screws 42. During placement of the wall, or thereafter, cord 13 is pulled through slot 23 to minimize the length of cord inside the housing. After a minimum length of cord has been left in the housing, the cord is curled around post 22 as previously described and cover 16 is secured to provide a strain relief.

Arrangement 10 provides strain relief with a cord having a minimum length within the housing. This is advantageous because the cord within the housing is not free to move against other objects in the housing and costs less.

The apparatus described above may be modified by artisans in ways which are consistent with the spirit of the invention. Therefore, it should be understood that the description herein of a preferred embodiment, according to the invention, has been set forth as an example thereof and should not be construed or interpreted to limit the scope of the claims which follow and define the invention.

I claim:

1. Strain relief apparatus, supported by a wall of a housing, for selectively permitting relative motion between a cord extending into the housing and the wall, comprising:

a member having a cavity extending towards the inside of the housing from the outside of the wall and a first slot in communication with the cavity and the inside of the housing;

a post supported in the cavity;

a movable cover for the cavity; and means for securing the cover to the member from the outside of the wall, the secured cover cooperating with the member to define a second slot;

whereby, with the cover secured, if the cord extends through the first slot, around the post and through the second slot, the cord will be anchored to the wall with the apparatus and, with the cavity uncovered, the cord can be moved with respect to the wall through the first slot.

2. Strain relief apparatus as defined in claim 1 wherein said means for securing the cover includes, first means for coupling the cover to the post and second means spaced from the first means for coupling the cover to the wall.

3. Strain relief apparatus as defined in claim 2 wherein said first means includes a screw.

4. Strain relief apparatus as defined in claim 2 wherein said second means includes at least one hole in said member and at least one finger in the cover, each of said at least one finger being movable through a corresponding one of said at least one hole and into engagement with the wall when the cover is moved to a position covering the cavity.

5. Strain relief apparatus as defined in claim 4 wherein the member and wall define a depressed region, adjacent the cavity, for accommodating the cover when it is moved to a position covering the cavity and said first means includes a screw.

6. Strain relief apparatus as defined in claim 1 wherein the wall, the member and the post are parts of an integral arrangement and the post extends within the cavity along a direction normal to the wall.

7. Strain relief apparatus as defined in claim 6 wherein said means for securing the cover includes first means for coupling the cover to the end of the post; and second means, spaced from the first means, for coupling the cover to the wall.

8. Strain relief apparatus as defined in claim 7 wherein said second means includes at least one hole in said member and at least one finger in the cover, each of said at least one finger being movable through a corresponding one of said at least one hole and into engagement with the wall when the cover is moved to a position covering the cavity.

9. Strain relief apparatus as defined in claim 8 wherein the member and wall define a depressed region, adjacent the cavity, for accommodating the cover when it is moved to a position covering the cavity and said first means includes a screw.

10. Strain relief apparatus as defined in claim 8 wherein said cavity includes an annular section communicating with a groove section located between two of said holes and said cover includes an abutment located between two of said fingers whereby, when the cover is moved to a position covering the cavity, the abutment and groove section defines said second slot.

* * * * *